(12) United States Patent
Saito

(10) Patent No.: US 7,417,638 B2
(45) Date of Patent: Aug. 26, 2008

(54) DATA WRITE CIRCUIT

(75) Inventor: Satoru Saito, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 674 days.

(21) Appl. No.: 10/834,613

(22) Filed: Apr. 28, 2004

(65) Prior Publication Data

US 2004/0223388 A1 Nov. 11, 2004

(30) Foreign Application Priority Data

Apr. 28, 2003 (JP) ............................. 2003-124195

(51) Int. Cl.
G09G 5/39 (2006.01)
(52) U.S. Cl. .................................................. 345/531
(58) Field of Classification Search .................. 345/629
See application file for complete search history.

(56) References Cited

U.S. PATENT DOCUMENTS 5,781,479 A 7/1998 Kimura 6,369,826 B1* 4/2002 Shimotono et al. .......... 345/589
7,009,625 B2* 3/2006 Dickinson ................... 345/629
2003/0193512 A1* 10/2003 Komagata ................... 345/629
2005/0068336 A1* 3/2005 Van Dyke et al. ........... 345/629

FOREIGN PATENT DOCUMENTS

JP 2001-34258 2/2001

* cited by examiner

*Primary Examiner*—Kee M. Tung
*Assistant Examiner*—Jacinta Crawford
(74) *Attorney, Agent, or Firm*—SoCal IP Law Group LLP; Steven C. Sereboff; John E. Gunther

(57) ABSTRACT

A data write circuit includes a receiver which receives pixel data with an affix of display state designating data for designating a display state; a setting section in which set are write control data containing first display state designating data for designating a specific display state and write mode designating data for designating a write mode when the data is written into the memory; and a controller which performs control to write data corresponding to the pixel data into the memory, in accordance with a write mode designated by the write mode designating data, depending on a relationship between the display state designating data and the first display state designating data.

17 Claims, 13 Drawing Sheets

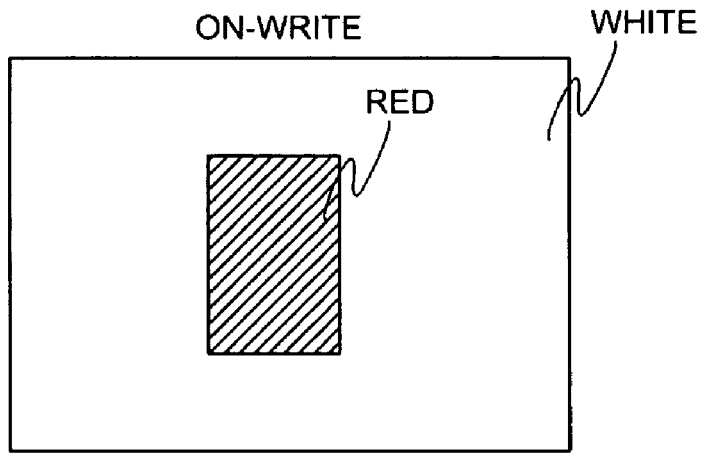
FIG. 6A
FIG. 6B
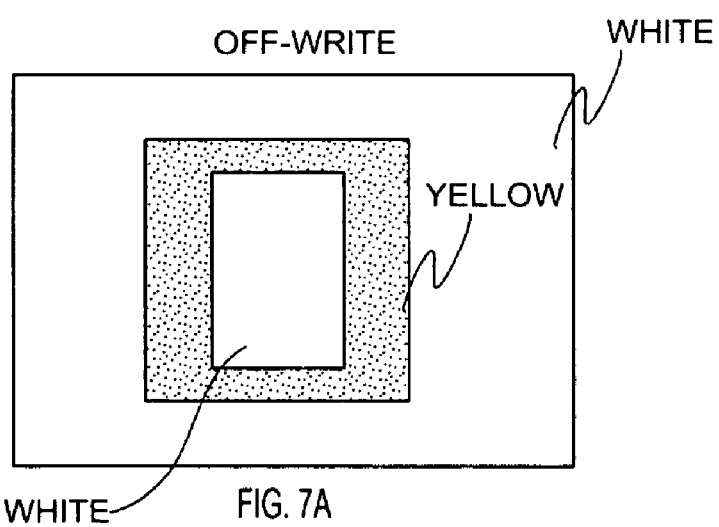
FIG. 7A
FIG. 7B

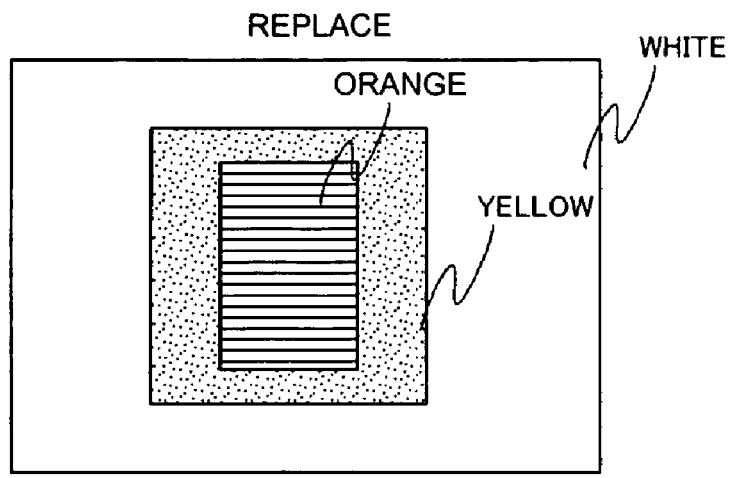
FIG. 8A
FIG. 8B
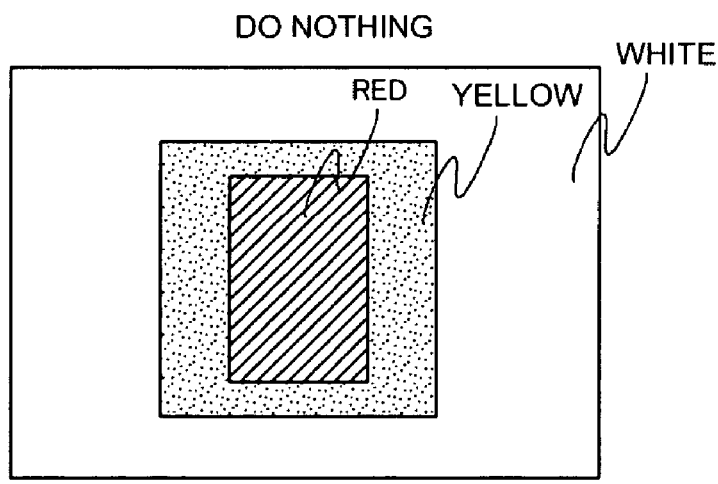
FIG. 9A
FIG. 9B

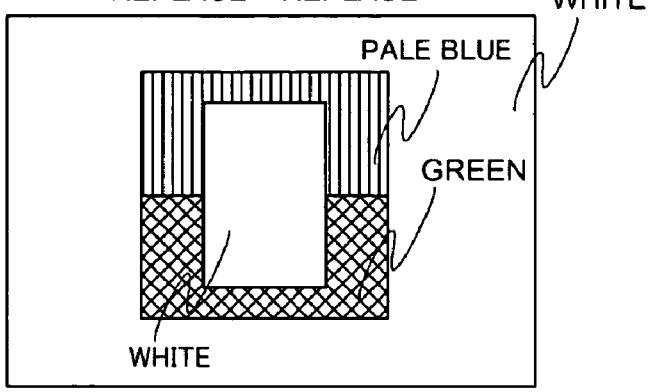
FIG. 15A
FIG. 15B
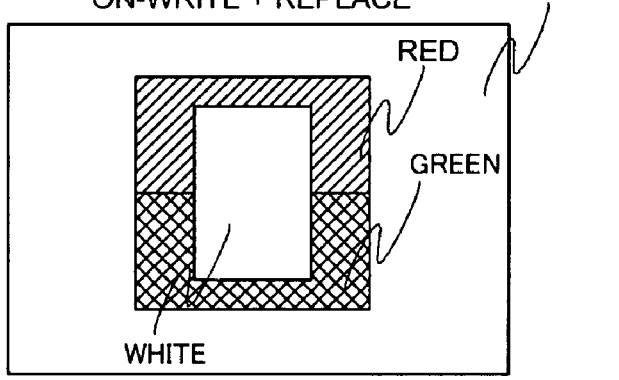
FIG. 16A
FIG. 16B

| A<br>FIRST DATA MASK MODE REGISTER | B<br>SECOND DATA MASK MODE REGISTER | C | OUTPUT WHEN A AND B AND C ARE MET |
|---|---|---|---|
| DO NOTHING | ON-WRITE | DATA MASK SETTING VALUE 2 AND DISPLAY STATE DESIGNATING DATA ARE NOT EQUAL | WRITE DISABLE |
| DO NOTHING | OFF-WRITE | DATA MASK SETTING VALUE 2 AND DISPLAY STATE DESIGNATING DATA ARE EQUAL | WRITE DISABLE |
| ON-WRITE | DO NOTHING | DATA MASK SETTING VALUE 1 AND DISPLAY STATE DESIGNATING DATA ARE NOT EQUAL | WRITE DISABLE |
| ON-WRITE | OFF-WRITE | DATA MASK SETTING VALUE 1 AND DISPLAY STATE DESIGNATING DATA ARE NOT EQUAL | WRITE DISABLE |
| ON-WRITE | ON-WRITE | DATA MASK SETTING VALUE 1 AND DISPLAY STATE DESIGNATING DATA ARE NOT EQUAL, AND DATA MASK SETTING VALUE 2 AND DISPLAY STATE DESIGNATING DATA ARE NOT EQUAL | WRITE DISABLE |
| ON-WRITE | REPLACE | DATA MASK SETTING VALUE 1 AND DISPLAY STATE DESIGNATING DATA ARE NOT EQUAL, AND DATA MASK SETTING VALUE 2 AND DISPLAY STATE DESIGNATING DATA ARE NOT EQUAL | WRITE DISABLE |
| OFF-WRITE | DO NOTHING | DATA MASK SETTING VALUE 1 AND DISPLAY STATE DESIGNATING DATA ARE EQUAL | WRITE DISABLE |
| OFF-WRITE | ON-WRITE | DATA MASK SETTING VALUE 1 AND DISPLAY STATE DESIGNATING DATA ARE EQUAL, OR DATA MASK SETTING VALUE 2 AND DISPLAY STATE DESIGNATING DATA ARE EQUAL | WRITE DISABLE |
| OFF-WRITE | OFF-WRITE | DATA MASK SETTING VALUE 1 AND DISPLAY STATE DESIGNATING DATA ARE EQUAL | WRITE DISABLE |
| OFF-WRITE | REPLACE | DATA MASK SETTING VALUE 1 AND DISPLAY STATE DESIGNATING DATA ARE EQUAL | WRITE DISABLE |
| REPLACE | ON-WRITE | DATA MASK SETTING VALUE 1 AND DISPLAY STATE DESIGNATING DATA ARE NOT EQUAL, AND DATA MASK SETTING VALUE 2 AND DISPLAY STATE DESIGNATING DATA ARE NOT EQUAL | WRITE DISABLE |
| REPLACE | OFF-WRITE | DATA MASK SETTING VALUE 2 AND DISPLAY STATE DESIGNATING DATA ARE EQUAL | WRITE DISABLE |

FIG. 18

※"DISPLAY STATE DESIGNATING DATA" MEAN DISPLAY STATE DESIGNATING DATA ORIGINALLY AFFIXED TO PIXEL DATA.
WHEN A AND B AND C ARE NOT MET, MEMORY DATA MASK CONTROLLER 30 OUTPUTS WRITE ENABLE SIGNAL.

DATA WRITE CIRCUIT

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by any one of the patent disclosure as it appears in the Patent and Trademark Office patent files or records, but otherwise reserves all copyright and trade dress rights whatsoever.

RELATED APPLICATION INFORMATION

This application claims the benefit of priority to Japanese Patent Application No. 2003-124195 filed on Apr. 28, 2003, of which contents are incorporated herein by reference.

BACKGROUND OF THE INVENTION

1. Field of the Invention

The present invention relates to a data write circuit.

2. Description of the Related Art

For example, displaying an image, by using a computer, on an image display unit such as a display is performed by reading data written on a memory such as an image memory and generating image signals corresponding to the data. Writing the data into the memory is performed by a data write circuit capable of executing such processing. The data write circuit receives image data outputted from a central processing unit (CPU) and writes, into the memory, data corresponding to pixel data included in the image data. See, for example, Japanese Patent Application Laid-open Publication No. 2001-34258.

When rendering a pattern on an image display unit for example, there are quite a few occasions when a pattern is rendered which is obtained only by altering one or some of constituent parts of a master pattern. For example, each of patterns shown in FIGS. 22A to 22C can be understood to be rendered from a pattern shown in FIG. 21, which is made to be an original pattern, by omitting one of constituent parts thereof or changing one of display colors thereof. Many of patterns which can be understood as such patterns are capable of being rendered by utilizing image data of their original patterns.

In a conventional data write circuit, however, even when an image can be rendered by utilizing data of an original pattern as described above, a CPU side must prepare all of image data corresponding to the image which is to be newly rendered. Therefore, it could hardly be that the processing of writing data into a memory by the data write circuit was always efficiently performed.

SUMMARY OF THE INVENTION

An object of the present invention is to provide a data write circuit which can efficiently perform writing of data into a memory.

One aspect of the present invention to achieve the above object is a data write circuit which writes into a memory data corresponding to pixel data for displaying pixels of an image display unit, the data write circuit including: a receiver which receives pixel data with an affix of display state designating data for designating a display state; a setting section in which set are write control data containing first display state designating data for designating a specific display state and write mode designating data for designating a write mode when the data is written into the memory; and a controller which performs control to write data corresponding to the pixel data into the memory, in accordance with a write mode designated by the write mode designating data, depending on a relationship between the display state designating data and the first display state designating data.

Here, the memory is, for example, an image memory to be described later. The receiver receives, as the pixel data with an affix of a display state designating data for designating a display state, data corresponding to an original pattern, for example. The setting section is, for example, a write control information register to be described later. The first display state designating data is, for example, data to be set in a data mask setting value register to be described later. The write mode designating data is, for example, data to be set in a data mask mode register to be described later. Moreover, the write control data is, for example, data to be stored in a write control information register to be described later.

According to the data write circuit of the above aspect of the present invention as described above, data corresponding to received pixel data is written into the memory in accordance with a write mode designated by the write mode designating data, depending on a relationship between the display state designating data and the first display state designating data. Thus, it is possible to write data corresponding to various patterns into a memory by utilizing received pixel data. That is, for example, by receiving pixel data of an original pattern and then performing the above-mentioned control, it is possible to render various patterns utilizing the pixel data of the original pattern.

The write mode designating data is data which designates control of writing data corresponding to the pixel data into the memory when the display state designating data affixed to the pixel data coincides with the first display state designating data. By preparing such write mode designating data, it is possible to select pixel data with an affix of specific display state designating data and then write only data corresponding to the pixel data into a memory.

The write mode designating data is data which designate control of writing data corresponding to the pixel data into the memory when the display state designating data affixed to the pixel data does not coincide with the first display state designating data. By preparing such write mode designating data, it is possible to select pixel data with no affix of specific display state designating data and then write only data corresponding to the pixel data into a memory.

The write control data further contains second display state designating data for designating a specific display state, and the write mode designating data is data which, when the display state designating data affixed to the pixel data coincides with the first display state designating data, designate control of writing into the memory data corresponding to pixel data with an affix of the second display state designating data, instead of writing data corresponding to the former pixel data. By preparing such write mode designating data, it is possible to select pixel data with an affix of specific display state designating data, affix other display state designating data to the pixel data, and then write data corresponding to the obtained pixel data into a memory.

The write mode designating data is data which designate control of writing the received pixel data, as the data corresponding thereto, into the memory. By preparing such write mode designating data, it is possible to write the received data, as the data corresponding thereto.

The data write circuit further includes: a section which sets a plurality of groups of the write control data; and a section which writes data corresponding to the pixel data into the memory by performing control of writing data corresponding to the pixel data, which is to be performed in accordance with each of the received groups of write control data, in accordance with a condition set depending on a relationship between groups of the write mode designating data in the respective groups of write control data. By thus enabling a plurality of groups of write control data to be set, it is possible to render a wider variety of patterns.

Features and objects of the present invention other than the above will become clear by reading the description of the present specification with reference to the accompanying drawings.

DESCRIPTION OF THE DRAWINGS

For a more complete understanding of the present invention and the advantages thereof, reference is now made to the following description taken in conjunction with the accompanying drawings wherein:

FIG. 6A is a view for describing a pattern to be displayed on the screen of the display or the like, according to the embodiment of the present invention, and FIG. 6B is a view showing contents of the write control information register according to the embodiment of the present invention;

FIG. 7A is a view for describing a pattern to be displayed on the screen of the display or the like, according to the embodiment of the present invention, and FIG. 7B is a view showing contents of the write control information register according to the embodiment of the present invention;

FIG. 8A is a view for describing a pattern to be displayed on the screen of the display or the like, according to the embodiment of the present invention, and FIG. 8B is a view showing contents of the write control information register according to the embodiment of the present invention, FIG. 9A is a view for describing a pattern to be displayed on the screen of the display or the like, according to the embodiment of the present invention, and FIG. 9B is a view showing contents of the write control information register according to the embodiment of the present invention;

FIG. 15A is a view for describing a pattern to be displayed on the screen of the display or the like, according to the embodiment of the present invention, and FIG. 15B is a view showing contents of the write control information registers according to the embodiment of the present invention;

FIG. 16A is a view for describing a pattern to be displayed on the screen of the display or the like, according to the embodiment of the present invention, and FIG. 16B is a view showing contents of the write control information registers according to the embodiment of the present invention;

FIG. 18 is a view showing conditional expressions for controlling a memory data mask controller, according to the embodiment of the present invention;

FIG. 21 is a view for describing a pattern to be displayed on a screen of a display or the like; and FIGS. 22A to 22C are views for describing patterns to be displayed on the screen of the display or the like.

DETAILED DESCRIPTION OF THE INVENTION

At least the following matters will be made clear by the explanation in the present specification and the description of the accompanying drawings.

Figure 1:
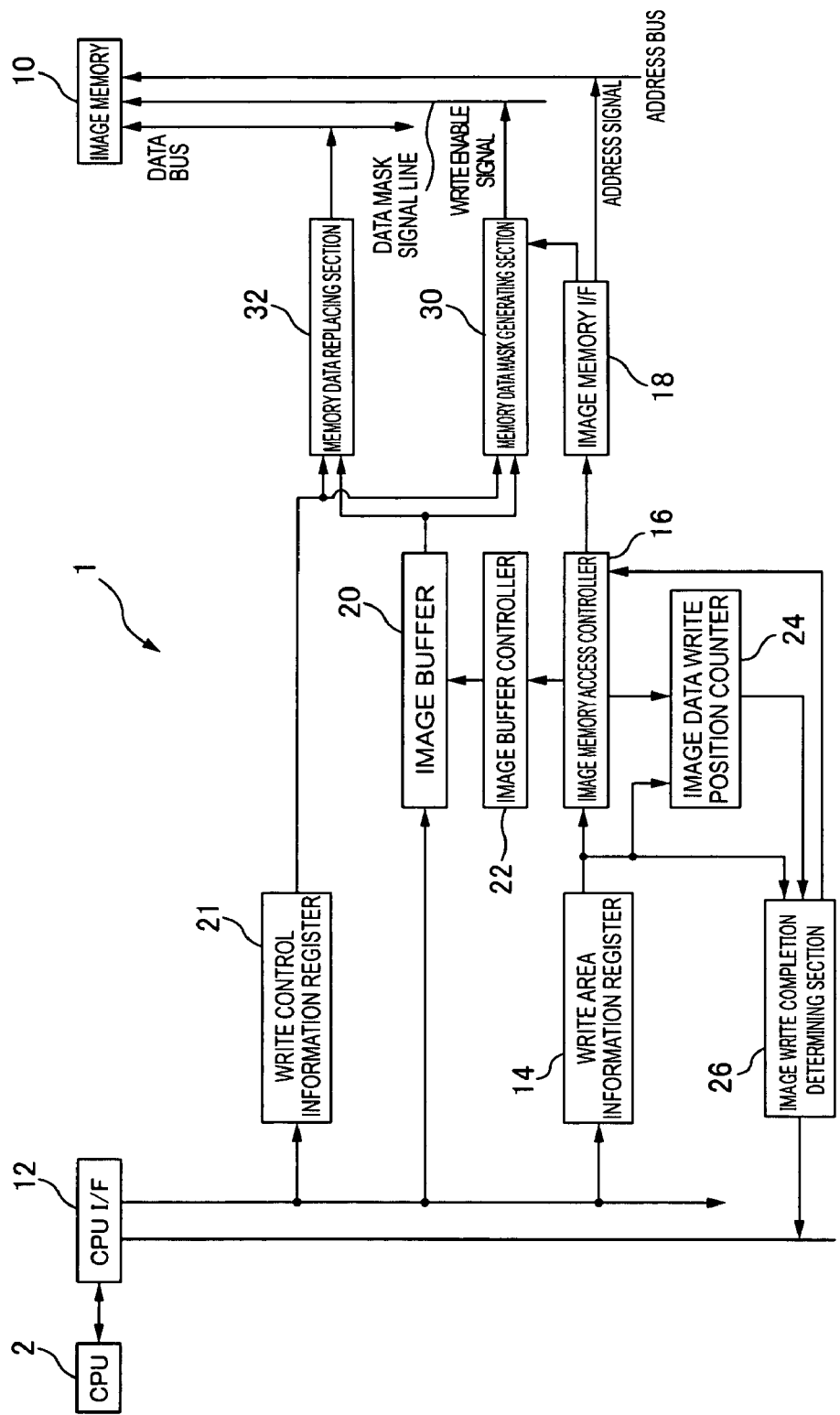
FIG. 1 is a block diagram for describing a data write circuit according to an embodiment of the present invention.

FIG. 1 shows a block diagram illustrating a general configuration of a data write circuit 1 of this embodiment. An image memory 10 is composed of, for example, a synchronous DRAM (SDRAM). Data stored in the image memory 10 is read out of the image memory 10, for example, in accordance with display timing and used, for example, to generate RGB signals to be provided to an image display unit such as a liquid crystal display or cathode-ray tube display. Note that the image memory 10 may be included in the data write circuit 1 or may be configured as a separate circuit from the data write circuit 1.

A variety of pieces of data are inputted and outputted between a CPU 2 and the data write circuit 1 via a CPU I/F 12. Image data is inputted from the CPU 2 into the data write circuit 1 via the CPU I/F 12. The image data is a group of pixel data which is data made to correspond to pixels of the image display unit. To each piece of the pixel data, affixed is data to designate a display state of the corresponding pixel data (hereinafter, referred to as display state designating data). The display state designating data includes, for example, data to designate a display color, data to designate lightness, data to control display/non-display, and the like.

When writing data into the data write circuit 1, the CPU 2 first sends write area information to the data write circuit 1. Upon receiving the write area information, the data write circuit 1 writes the information into a write area information register 14. A data bus and an address bus are connected to the CPU I/F 12. In a state where the write area information register 14 is appointed as an address on the address bus, the write area information set on the data bus is fetched in the write area information register 14. The write area information is, for example, data to designate an area on the image memory 10 by use of X, Y coordinates which are set so as to correspond to coordinates on a screen of the image display unit. In this case, the write area information is sequentially fetched in an x-coordinate register and a Y-coordinate register which are registers constituting the write area information register 14.

An image memory access controller 16 is connected with the write area information register 14. The write area information stored in the write area information register 14 is provided to the image memory access controller 16. Based on the write area information, the image memory access controller 16 determines a procedure for writing data onto the image memory 10 and, via an image memory I/F 18, sequentially sets access addresses to the image memory 10 on the address bus.

The image data sent from the CPU I/F 12 is once stored in an image buffer 20 in order to compensate for a difference in timing between a clock of the CPU 2 and an access clock to the image memory 10. Storing the image data in the image buffer 20 is performed by an image buffer controller 22 in accordance with signals from the image memory access controller 16. That is, the image data is sequentially written into the image buffer 20 at timing designated by the CPU 2.

Write control information is stored in a write control information register 21. The write control information is used in write control executed by a memory data mask generating section 30, a memory data replacing section 32 and the like, which will be described later, when data corresponding to the image data is written onto the image memory 10. In a state where the write control information register 21 is appointed as an address on the address bus, the write control information set on the data bus is fetched in the write control information register 21.

Figure 2:
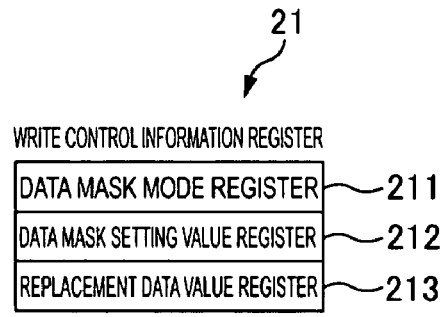
FIG. 2 is a view for describing a write control information register according to the embodiment of the present invention.

As shown in FIG. 2, the write control information register 21 includes a data mask mode register 211, a data mask setting value register 212, and a replacement data value register 213. Among these, the data mask mode register 211 stores data to designate a write mode to be used when the data corresponding to the image data is written onto the image memory 10. The data mask setting value register 212 stores display state designating data (hereinafter, referred to as first display state designating data) which is data to designate a specific display state. Note that the "data to designate a specific display state" is, for example, data to designate a specific display color. Meanwhile, the replacement data value register 213 stores other display state designating data (hereinafter, referred to as second display state designating data) which is data to designate a specific display state. The second display state designating data, as will be described later, is data to be affixed to the pixel data in place of the display state designating data affixed to the pixel data sent from the CPU 2.

The data write circuit 1 of this embodiment covers four types of modes as the above-mentioned write mode: "ON-write," "OFF-write," "Replace," and "Do nothing." The data mask mode register 211 stores data to designate one of these write modes. In accordance with the designated write mode in the data mask mode register 211, the data write circuit 1 controls writing of data corresponding to the pixel data onto the image memory 10. For example, when "ON-write" is set in the data mask mode register 211 as the write mode, and when the display state designating data affixed to the pixel data sent from the CPU 2 coincides with the first display state designating data stored in the data mask setting value register 212, the data write circuit 1 writes data corresponding to these pixel data onto the image memory 10, but does not when the display state designating data affixed to the pixel data does not coincide with the first display state designating data.

Moreover, when "OFF-write" is set in the data mask mode register 211 for example, and when the display state designating data affixed to the pixel data sent from the CPU 2 does not coincide with the first display state designating data stored in the data mask setting value resister 212, the data write circuit 1 writes data corresponding to these pixel data onto the image memory 10, but does not when the display state designating data affixed to the pixel data coincide with the first display state designating data.

Furthermore, when "Replace" is set in the data mask mode register 211, and when the display state designating data affixed to the pixel data sent from the CPU 2 coincides with the first display state designating data stored in the data mask setting value register 212, the data write circuit 1, in place of these pixel data sent from the CPU 2, writes data corresponding to the pixel data with an affix of the second display state designating data stored in the replacement data value register 213 onto the image memory 10.

Lastly, when "Do nothing" is set in the data mask mode register 211, the data write circuit 1 does not perform any manipulation, such as alteration, of the display state designating data affixed to the pixel data and writes data corresponding to the pixel data sent from the CPU 2 as they are.

The image data written in the image buffer 20 is sequentially set on the data bus to the image memory 10 at timing for writing the corresponding data onto the image memory 10. When the write addresses are set on the address bus from the image memory access controller 16 via the image memory I/F 18, the data is set on the data bus from the image buffer 20, and then written in the set addresses on the image memory 10.

An image data write position counter 24 is connected with the write area information register 14. The write area information register 14 provides the write area information to the image data write position counter 24. The image memory access controller 16 provides write information to the image data write position counter 24 every time writing onto the image memory 10 is executed. Thus, data to designate write positions is set in the image data write position counter 24. For example, the image data write position counter 24 has an X-direction counter and a Y-direction counter and sequentially counts up increment signals in X and Y directions sent from the image memory access controller 16, from an initial value which is made of starting X, Y coordinates in the write area information stored in the write area information register 14. Note that, in this case, the X-direction counter is reset upon counting up the signals in the Y direction.

The memory data mask generating section 30 is connected with the write control information register 21. To the memory data mask generating section 30, connected are data mask signal lines which are signal lines, also connected to the image memory 10, for controlling the writing of data onto the image memory 10. The memory data mask generating section 30 outputs any of a write enable signal and a write disable signal to the data mask signal line. The write enable signal is a signal to permit data corresponding to each pixel data to be written onto the image memory 10, and the write disable signal is a signal to inhibit the data from being written onto the image memory 10.

Figure 3:
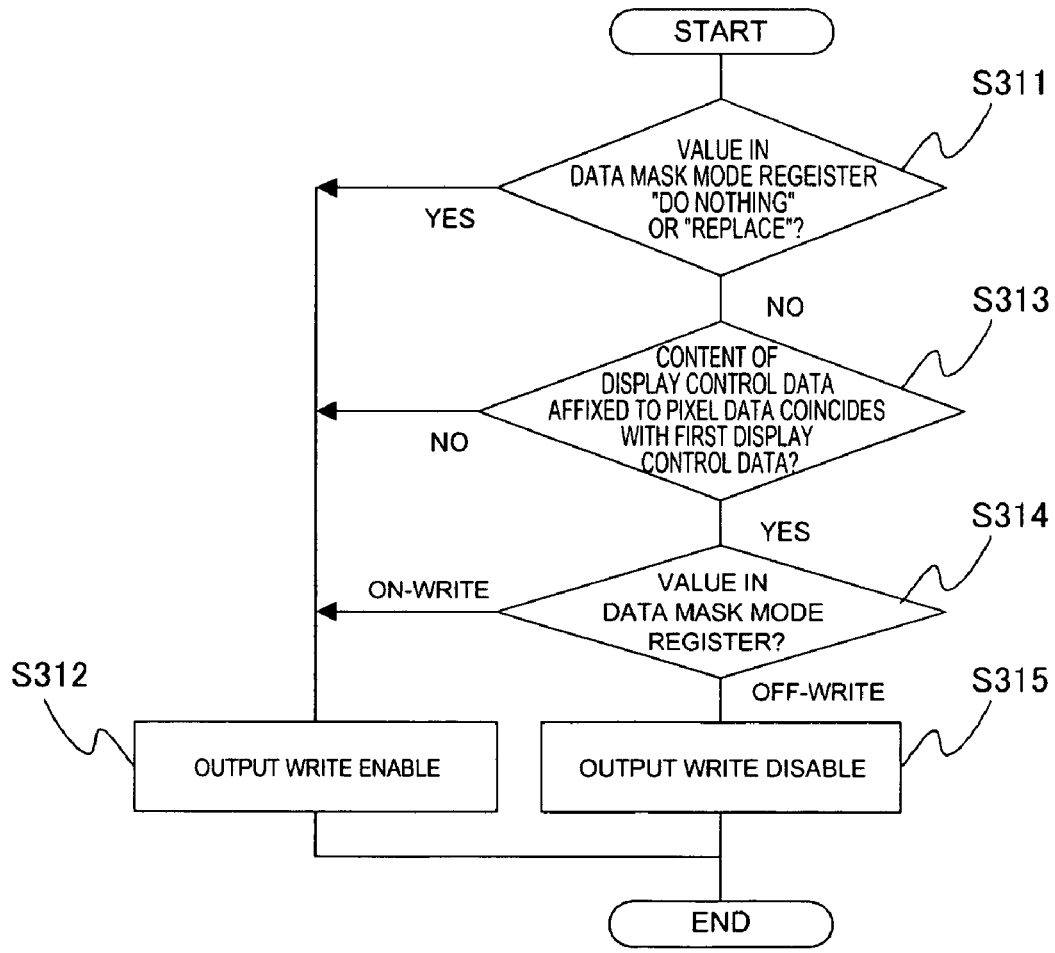
FIG. 3 is a flowchart for describing processing by a memory data mask generating section according to the embodiment of the present invention.

A description will be given of processing concerning switching between the write enable signal and the write disable signal, which is executed by the memory data mask generating section 30, with reference to a flowchart shown in FIG. 3. When a value in the data mask mode register 211 is "Do nothing" or "Replace" (S311: YES), the memory data mask generating section 30 outputs a write enable signal to the data mask signal line associated with pixel data in question (S312). On the other hand, when a value in the data mask mode register 211 is "ON-write" or "OFF-write" (S311: NO), and when the content of display state designating data affixed to pixel data in question does not coincide with the content of the first display state designating data stored in the data mask setting value register 212 (S313: NO), the memory data mask generating section 30 outputs an write enable signal to the data mask signal line associated with the pixel data in question (S312). On the other hand, when the content of display state designating data affixed to pixel data in question coincides with the content of the first display state designating data (S313: YES), and when a value in the data mask mode register 211 is "ON-write" (S314: ON-write), the memory data mask generating section 30 outputs a write enable signal to the data mask signal line associated with the pixel data in question (S312), but when a value in the data mask mode register 211 is "OFF-write" (S314: OFF-write), the memory data mask generating section 30 outputs a write disable signal to the data mask signal line associated with the pixel data in question (S315).

Figure 4:
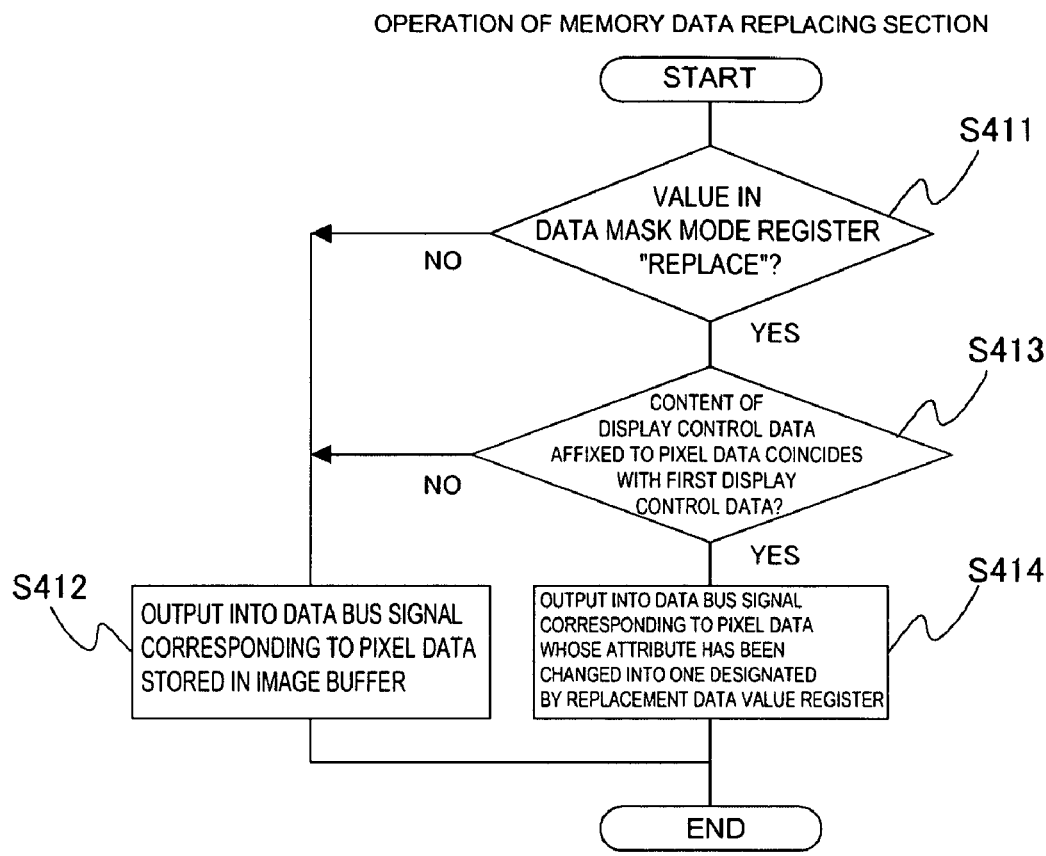
FIG. 4 is a flowchart for describing processing by a memory data replacing section according to the embodiment of the present invention.

The memory data replacing section 32 is connected with the write control register 21. Moreover, to the memory data replacing section 32, connected are an input signal line from the image buffer 20 and a data bus which is a signal line for providing data to be written to the image memory 10. The memory data replacing section 32 alters the content of pixel data to be written onto the image memory 10 in accordance with the contents of the write control information register 21. A description will be given of processing executed by the memory data replacing section 32 in this case, with reference to a flowchart shown in FIG. 4.

First, when a value in the data mask mode register 211 is not "Replace" (S411: NO), the memory data replacing section 32 outputs data corresponding to pixel data stored in the image buffer 20, to the data bus (S412). On the other hand, when a value in the data mask mode register 211 is "Replace" (S411: YES), and when the content of display state designating data affixed to pixel data in question does not coincide with the content of the first display state designating data stored in the data mask setting value register 212 (S413: NO), the memory data replacing section 32 outputs data corresponding to the pixel data in question stored in the image buffer 20 (S412). On the other hand, when the content of display state designating data affixed to pixel data in question coincides with the content of the first display state designating data (S413: YES), the memory data replacing section 32 outputs data corresponding to the pixel data with an affix of the second display state designating data in place of the original pixel data sent from the CPU 2 (S414).

Referring to FIG. 1, count values counted by the image data write position counter 24 are provided to an image write completion determining section 26. This image write completion determining section 26 is also provided with the write area information from the write area information register 14. The image write completion determining section 26 compares both the provided pieces of information, thereby determining whether writing over the write area has been completed. Upon determining the completion, the image write completion determining section 26 provides the image memory access controller 16 with completion determination information which is a result of the determination. Upon receiving this completion determination information, the image memory access controller 16 finishes the processing of writing over the set write area. Thus, the image memory access controller 16 comes into a state ready to accept new image data next sent from the CPU 2.

Concrete Description

Next, a concrete description will be given of operation, functions and the like of the data write circuit 1 configured as described above, together with screen images which will be displayed on an image display unit by the data write circuit 1 writing data corresponding to image data onto the image memory 10. A description will be given here of a case where various patterns are rendered on a white back plane by using image data corresponding to an original pattern shown in FIG. 5.

FIG. 6A shows a case where rendering is performed while the "ON-write" mode of the aforementioned write modes is set in the data mask mode register 211. FIG. 6B shows contents of the write control information register 21 set from the CPU 2 side for this rendering. Here, first display state designating data to designate "red" as a display color is set in the data mask setting value register 212 in order that only a red part in the pattern shown in FIG. 5 will be rendered. Thus, only the red part of constituent parts of the pattern in FIG. 5 will be rendered, and as a result, a pattern shown in FIG. 6A is rendered.

FIG. 7A shows a case where rendering is performed while the "OFF-write" mode of the aforementioned write modes is set in the data mask mode register 211. FIG. 7B shows contents of the write control information register 21 set from the CPU 2 side for this rendering. Here, first display state designating data to designate "red" as a display color is set in the data mask setting value register 212 in order that the red part in the pattern shown in FIG. 5 will not be rendered. Thus, only a yellow part of the constituent parts of the pattern in FIG. 5 will be rendered, and as a result, a pattern shown in FIG. 7A is rendered.

FIG. 8A shows a case where rendering is performed while the "Replace" mode of the aforementioned write modes is set in the data mask mode register 211. FIG. 8B shows contents of the write control information register 21 set from the CPU 2 side for this rendering. Here, first display state designating data to designate "red" as a display color is set in the data mask setting value register 212 and second display state designating data to designate "orange" as a display color is set in the displacement data value register 213 so that the color of the red part of the constituent parts of the pattern shown in FIG. 5 will be changed into orange to be rendered. Thus, only the yellow part of the constituent parts of the pattern in FIG. 5 will be rendered, and as a result, a pattern shown in FIG. 8A is rendered.

Figure 5:
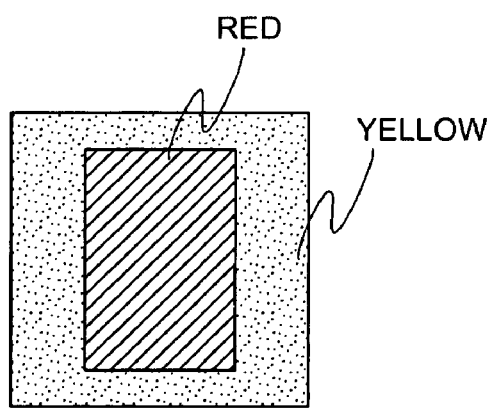
FIG. 5 is a view for describing a pattern to be displayed on a screen of a display or the like, according to the embodiment of the present invention.

FIG. 9A shows a case where rendering is performed while the "Do nothing" mode of the aforementioned write modes is set in the data mask mode register 211. FIG. 9B shows contents of the write control information register 21 in this case. As shown in FIG. 9B, values are not particularly set in the data mask setting value register 212 and the replacement data value register 213 in this case (the values are not particularly used even if they are set). In this case, the pattern shown in FIG. 5 will be rendered as it is, and as shown in FIG. 9A, the pattern in FIG. 5 is rendered as it is.

As described above, according to the data write circuit 1 of the present invention, only by inputting image data of an original pattern and setting data in the write control information register 21 from the CPU 2 side, it is possible to write onto the image memory 10 data for rendering various patterns such as a pattern obtained by omitting part of a pattern to be a master and a pattern obtained by replacing part of the master pattern. That is, it is possible to render various patterns only by the CPU 2 side preparing image data corresponding to the original pattern. The use of the data write circuit 1 of this embodiment will reduce processing loads on the CPU 2 side to render patterns. Moreover, the variety of write modes, such as "ON-write," "OFF-write," "Replace," and "Do nothing," can be set from the CPU 2 side, and thus it is possible to render various types of patterns efficiently by using the image data of the original pattern.

Designation of a Plurality of Modes

Figure 10:
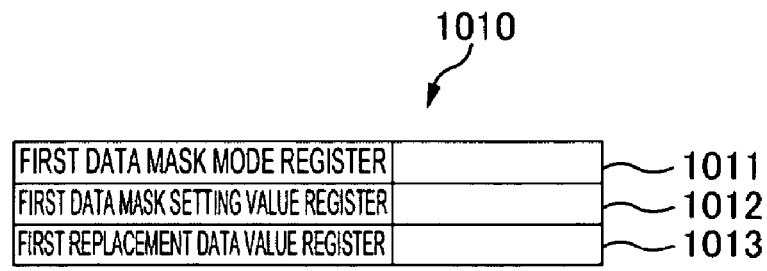
FIG. 10 is a view for describing a first write control information resister according to an embodiment of the present invention.
Figure 11:
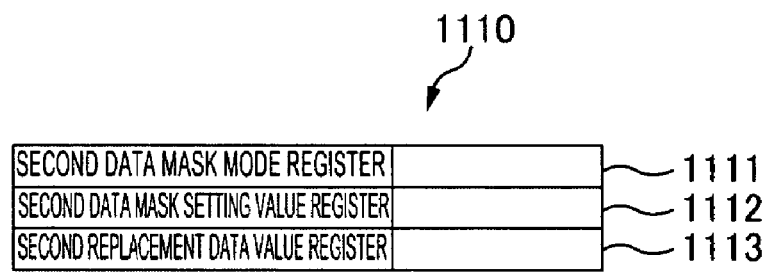
FIG. 11 is a view for describing a second write control information resister according to the embodiment of the present invention.
Figure 12:
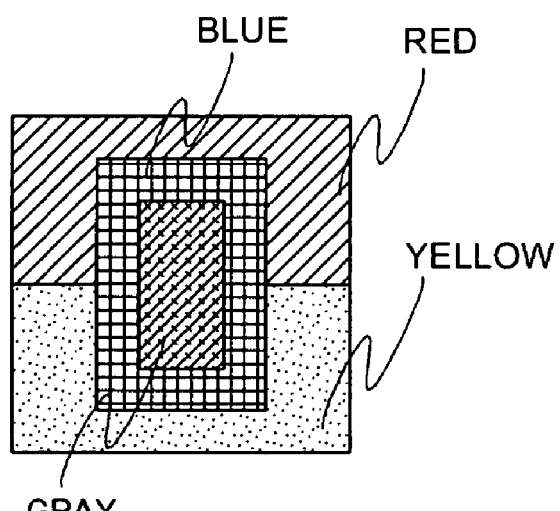
FIG. 12 is a view for describing a pattern to be displayed on a screen of a display or the like, according to the embodiment of the present invention.

Hereinbefore, description has been given of the case where the data write circuit includes only one write control information register 21. However, the provision of a plurality of the write control information registers 21 in the data write circuit will make variations of a pattern produced from an original pattern rich in variety. A description will be given below of an embodiment of a data write circuit including two write control information registers 21. Note that, in the description below, the data write circuit is assumed to include, as the write control information registers 21, a first write control information register 1010 including a first data mask mode register 1011, a first data mask setting value register 1012 and a first replacement data value register 1013, and a second write control information resister 1110 including a second data mask mode register 1111, a second data mask setting value register 1112 and a second replacement data value register 1113, as shown in FIGS. 10 and 11. A description will be given here of a case where various patterns are rendered on a white back plane by using image data corresponding to an original pattern sent from the CPU 2, as shown in FIG. 12.

Figure 13A:
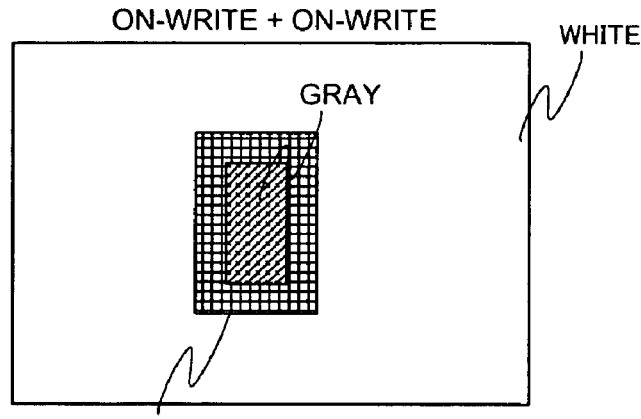
FIG. 13A is a view for describing a pattern to be displayed on the screen of the display or the like, according to the embodiment of the present invention.
Figure 13B:
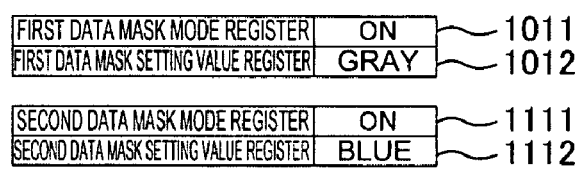
FIG. 13B is a view showing contents of the write control information registers according to the embodiment of the present invention.

FIG. 13A is an example of a case where rendering is performed while the "ON-write" modes are respectively set in the first and second data mask mode registers 1011 and 1111. FIG. 13B shows respective contents of the first and second write control information registers 1010 and 1110 set from the CPU 2 side for this rendering. Here, display state designating data to designate "gray" as a display color is set in the first data mask setting value register 1012 and display state designating data to designate "blue" as a display color is set in the second data mask setting value register 1112 so that only gray and blue parts in the pattern shown in FIG. 12 will be rendered. Thus, only the gray and blue parts in the pattern shown in FIG. 12 will be rendered, and as a result, a pattern shown in FIG. 13A is rendered.

Figure 14A:
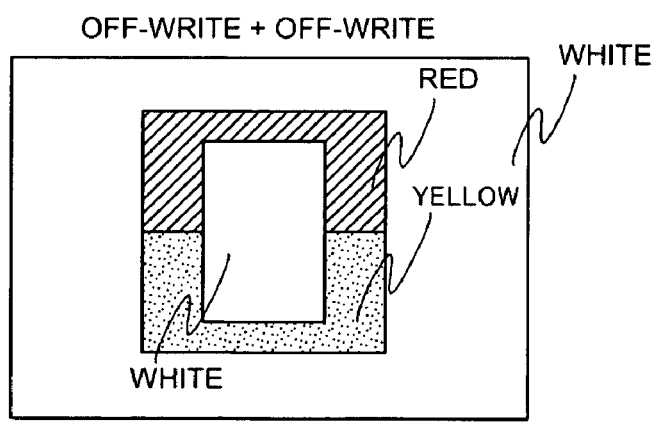
FIG. 14A is a view for describing a pattern to be displayed on the screen of the display or the like, according to the embodiment of the present invention.
Figure 14B:
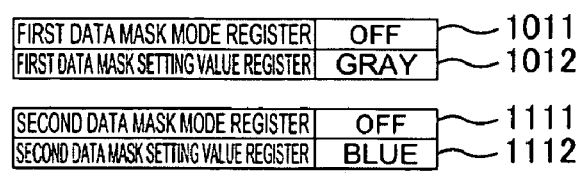
FIG. 14B is a view showing contents of the write control information registers according to the embodiment of the present invention.

FIG. 14A is an example of a case where rendering is performed while the "OFF-write" modes are respectively set in the first and second data mask mode registers 1011 and 1111. FIG. 14B shows respective contents of the first and second write control information registers 1010 and 1110 set from the CPU 2 side for this rendering. Here, display state designating data to designate "gray" as a display color is set in the first data mask setting value register 1012 and display state designating data to designate "blue" as a display color is set in the second data mask setting value register 1112 so that the gray and blue parts in the pattern shown in FIG. 12 will not be rendered. Thus, only red and yellow parts, except the gray and blue parts, in the pattern shown in FIG. 12 will be rendered, and as a result, a pattern shown in FIG. 14A is rendered.

FIG. 15A is an example of a case where rendering is performed while the "Replace" modes are respectively set in the first and second data mask mode registers 1011 and 1111. FIG. 15B shows respective contents of the first and second write control information registers 1010 and 1110 set from the CPU 2 side for this rendering. Here, display state designating data to designate "red" as a display color is set in the first data mask setting value register 1012 and display state designating data to designate "pale blue" as a display color is set in the first replacement data value register 1013 so that the color of a red part in the pattern shown in FIG. 12 is changed into pale blue to be rendered. Moreover, display state designating data to designate "yellow" as a display color is set in the second data mask setting value register 1112 and display state designating data to designate "green" as a display color is set in the second replacement data value register 1113. Thus, a pattern obtained by changing the color of the red part in the pattern shown in FIG. 12 into pale blue, and a pattern obtained by changing the color of a yellow part in the pattern shown in FIG. 12 into green will be rendered, and as a result, a pattern shown in FIG. 15A is rendered.

Although the foregoing are cases where the same modes are set in the first and second data mask mode registers 1011 and 1111, different write modes can be respectively set in the first and second data mask mode registers 1011 and 1111.

FIG. 16A is an example of a case where rendering is performed while the "ON-write" and "Replace" modes are set in the first and second data mask mode registers 1011 and 1111, respectively. FIG. 16B shows respective contents of the first and second write control information registers 1010 and 1110 set from the CPU 2 side for this rendering. Here, display state designating data to designate "red" as a display color is set in the first data mask setting value register 1012 so that only the red part in the pattern shown in FIG. 12 will be rendered. Moreover, display state designating data to designate "yellow" as a display color is set in the second data mask setting value register 1112 and display state designating data to designate "green" as a display color is set in the second replacement data value register 1113 so that the color of the yellow part in the pattern shown in FIG. 12 is changed into green to be rendered. Thus, a pattern corresponding to the red part of the constituent parts of the pattern shown in FIG. 12 and a pattern obtained by changing the color of the yellow part into green will be rendered, and as a result, a pattern shown in FIG. 16A is rendered.

Figures 17A, 17B:
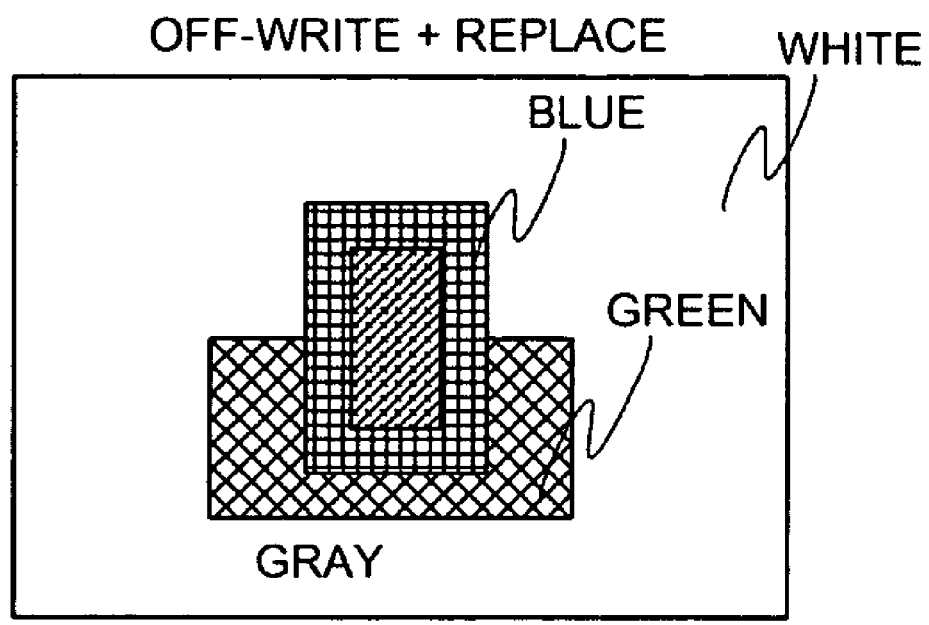
FIG. 17A is a view for describing a pattern to be displayed on the screen of the display or the like, according to the embodiment of the present invention.
FIG. 17B is a view showing contents of the write control information registers according to the embodiment of the present invention.

FIG. 17A is an example of a case where rendering is performed while the "OFF-write" and "Replace" modes are set in the first and second data mask mode registers 1011 and 1111, respectively. FIG. 17B shows respective contents of the first and second write control information registers 1010 and 1110 set from the CPU 2 side for this rendering. Here, display state designating data to designate "red" as a display color is set in the first data mask setting value register 1012 so that the red part in the pattern shown in FIG. 12 will not be rendered. Moreover, display state designating data to designate "yellow" as a display color is set in the second data mask setting value register 1112 and display state designating data to designate "green" as a display color is set in the second replacement data value register 1113 so that the color of the yellow part in the pattern shown in FIG. 12 is changed into green to be rendered. Thus, a pattern corresponding to the other parts than the red part in the pattern shown in FIG. 12 and a pattern obtained by changing the color of the yellow part into green will be rendered, and as a result, a pattern shown in FIG. 17A is rendered.

Figure 19:
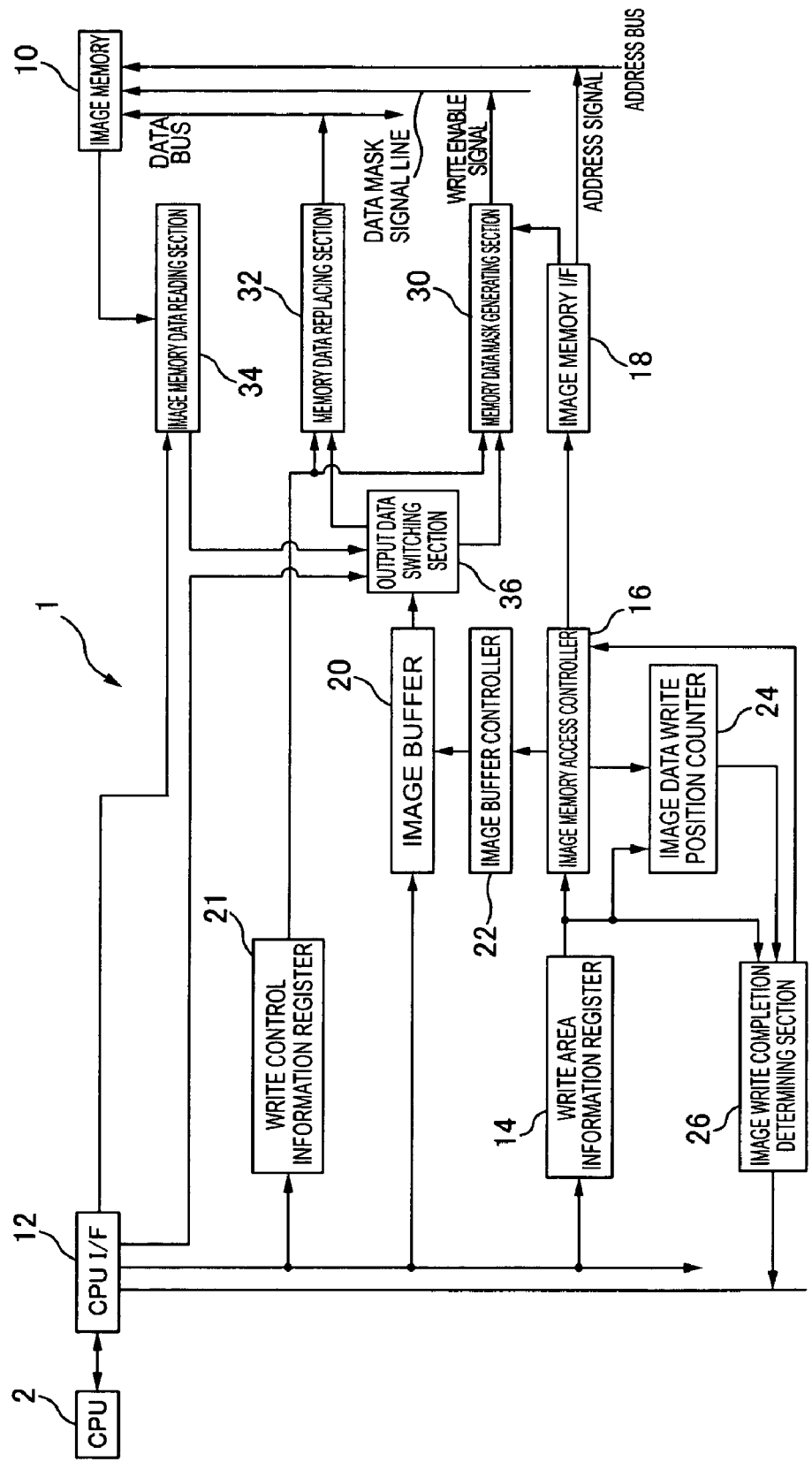
FIG. 19 is a view showing conditional expressions for controlling the memory data replacing section, according to the embodiment of the present invention.

Note that the control of the memory data mask generating section 30 in the above-described cases where the data write circuit includes two write control information registers, is executed, for example, in accordance with conditional expressions shown in FIG. 18. FIG. 18 shows signals to be outputted from the memory data mask generating section 30 to the data mask signal line when a condition "A and B and C" is met. When the conditions shown in the table of FIG. 18 are not met, a write enable signal is outputted to the data mask signal line. Note that "display state designating data" in this table means display state designating data originally affixed to pixel data. Moreover, the control of the memory data replacing section 32 is executed, for example, in accordance with conditional expressions shown in FIG. 19. FIG. 19 shows contents of display state designating data to be affixed to pixel data when a condition "A and B and C" is met.

When the data write circuit includes a plurality of the write control information resisters 21 as described above, flexible control can be performed by controlling the memory data mask generating section 30 and the memory data replacing section 32 in accordance with the conditional expressions set depending on relationships between the data mask mode resisters of the respective write control information registers 21, and thus flexible responses to user's needs can be achieved.

Other Embodiments

The above description was given of the case where the image data of an original pattern is provided from the CPU 2. However, the following case, for example, is possible. Specifically, the data write circuit 1 is provided with a function to copy data in some area on the image memory 10, into another area. In execution of processing concerning the copying, image data based on the data, which is master data, on the image memory 10 is processed in accordance with contents of the write control information register 21, thereby enabling various patterns to be rendered.

Figure 20:
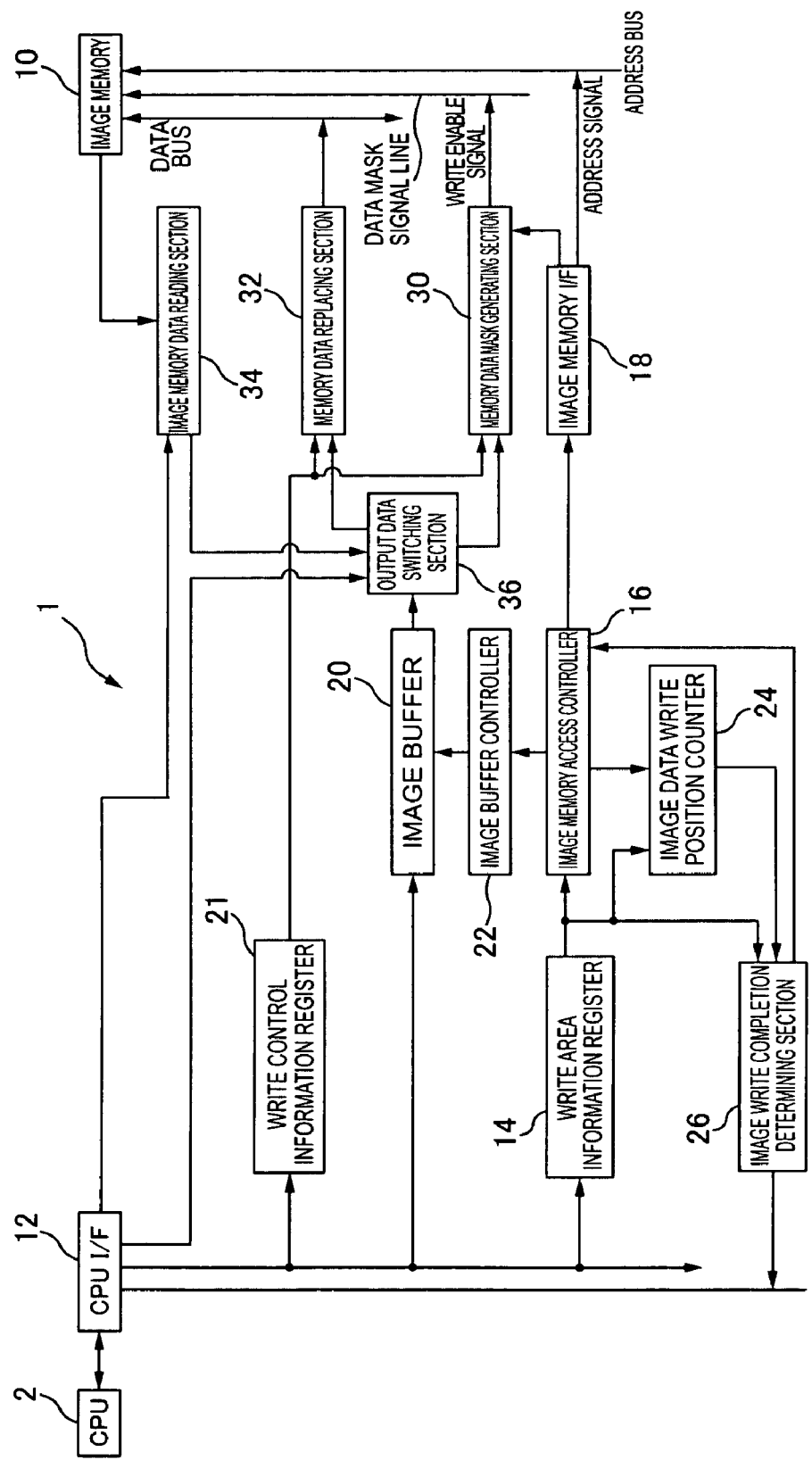
FIG. 20 is a view for describing a block diagram of a data write circuit according to another embodiment of the present invention.
Figure 21:
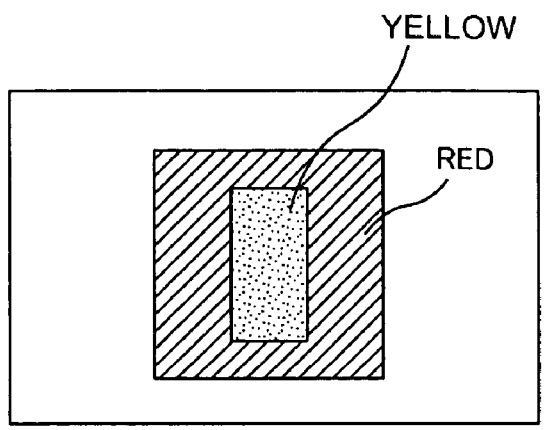
Figure 22A:
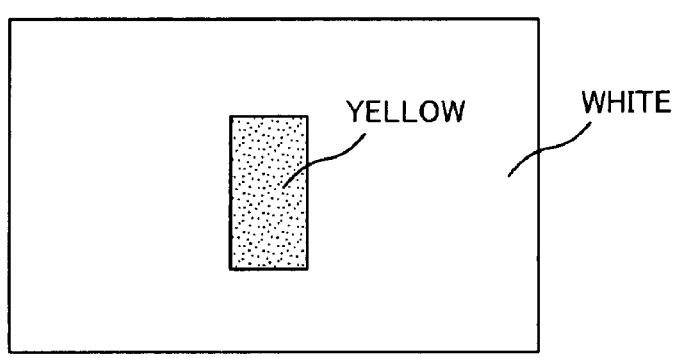
Figure 22B:
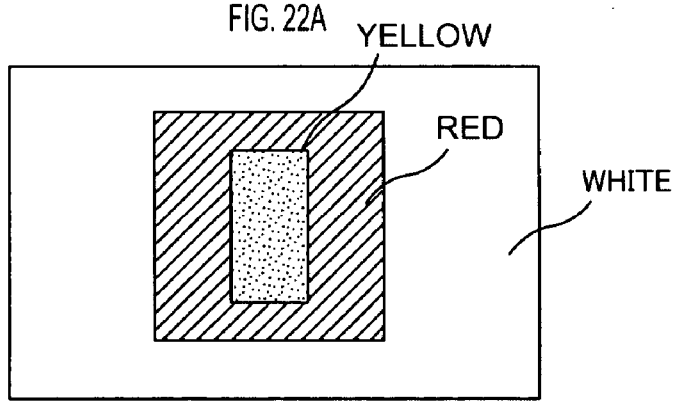
Figure 22C:
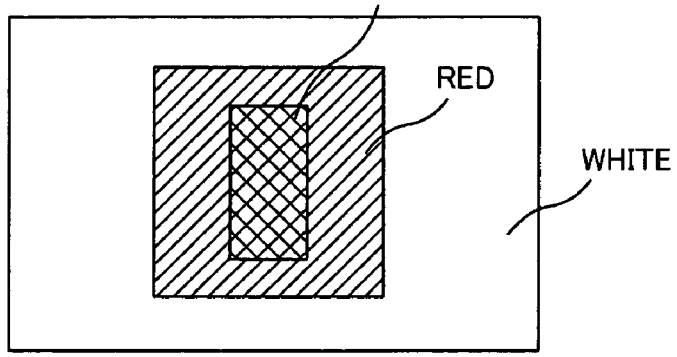

FIG. 20 shows an example of the data write circuit 1 having such a function. This data write circuit 1 includes an image memory data reading section 34 and an output data switching section 36 in addition to the foregoing configuration of the data write circuit 1 shown in FIG. 1. In this data write circuit 1, the image memory data reading section 34 and the output data switching section 36 are individually connected with the CPU 2 so as to be communicable therewith. Each of these sections is controllable directly from the CPU 2.

When performing the copying, the CPU 2 controls the image memory data reading section 34 to transfer data written in a given area on the image memory 10 to a buffer in the image memory data reading section 34. The output data switching section 36 functions as a switch which selects any of data stored in the image buffer 20 and the image memory data reading section 34 to input into the memory data replacing section 32 and the memory mask generating section 30, in accordance with the control from the CPU 2. The CPU 2 controls the output data switching section 36 at timing for writing the data onto the image memory 10 to switch the state so that the image data stored in the buffer in the image memory data reading section 34 will be inputted into the memory data replacing section 32 and the memory data mask generating section 30. Thus, data corresponding to the data stored in the buffer in the image memory data reading section 34 is inputted into the memory data replacing section 32 and the memory data mask generating section 30. Thereafter, similarly to the forgoing case where the data is inputted from the image buffer 20, control in accordance with contents of the write control information register 21 is performed by the memory data replacing section 32 and the data mask generating section 30. Thus, data corresponding to the data inputted from the image memory data reading section 34 is written onto the image memory 10.

According to the above-described configuration, in the processing of copying a pattern written in some area on the image memory 10 into another area on the image memory, it is possible to efficiently write data corresponding to various patterns onto the image memory 10 by utilizing the data written in the some area on the image memory 10 as data of an original pattern. Moreover, it is possible to render various patterns utilizing image data stored in the image memory 10, only by the CPU 2 setting values in the write control information register 21 without providing another image data, thus reducing the processing loads on the CPU 2 side in rendering of patterns.

Note that, although description was given of the data write circuits each of which writes image data onto the image memory 10 in the forgoing embodiments, the data write circuits are applicable to a case where data is written into a memory of a type other than the image memory, as a matter of course. In addition, the data write circuits described above can be integrated as an integrated circuit such as an OSD (on screen display) LSI. The integration makes it possible to facilitate the application to a variety of products and to achieve power savings and the like.

Although the embodiments have been described above, the above-described embodiments are to facilitate the understanding of the present invention and are not intended to limitedly interpret the present invention. For the present invention, changes and modifications can be made without departing from the scope thereof, and the equivalencies of the present invention are also included therein.

According to the present invention, it is possible to provide a data write circuit and an integrated circuit which can effectively write data into a memory.

Although the preferred embodiment of the present invention has been described in detail, it should be understood that various changes, substitutions and alterations can be made therein without departing from spirit and scope of the inventions as defined by the appended claims.

It is claimed:

1. A data write circuit which writes into a memory data corresponding to pixel data for displaying pixels of an image display unit, the data write circuit comprising:
    a receiver which receives pixel data with an affix of display state designating data for designating a display state;
    a setting section in which write control data is set, the write control data containing first display state designating data for designating a specific display state and write mode designating data for designating a write mode when the data is written into the memory; and
    a controller which performs control to write data corresponding to the pixel data into the memory, in accordance with a write mode designated by the write mode designating data, depending on a relationship between the display state designating data and the first display state designating data.

2. The data write circuit according to claim 1, wherein the write mode designating data is data which designates control of writing data corresponding to the pixel data into the memory when the display state designating data affixed to the pixel data coincides with the first display state designating data.

3. The data write circuit according to claim 2, wherein the write mode designating data is data which designates control of writing data corresponding to the pixel data into the memory when the display state designating data affixed to the pixel data does not coincide with the first display state designating data.

4. The data write circuit according to claim 3, wherein the write control data further contains second display state designating data for designating a specific display state, and the write mode designating data is data which, when the display state designating data affixed to the pixel data coincides with the first display state designating data, designates control of writing into the memory data corresponding to pixel data with an affix of the second display state designating data, instead of writing data corresponding to the pixel data.

5. The data write circuit according to claim 4,
wherein the write mode designating data is data which designates control of writing the received pixel data, as the data corresponding thereto, into the memory.

6. The data write circuit according to claim 3,
wherein the write mode designating data is data which designates control of writing the received pixel data, as the data corresponding thereto, into the memory.

7. The data write circuit according to claim 2,
wherein the write control data further contains second display state designating data for designating a specific display state, and
the write mode designating data is data which, when the display state designating data affixed to the pixel data coincides with the first display state designating data, designates control of writing into the memory data corresponding to pixel data with an affix of the second display state designating data, instead of writing data corresponding to the pixel data.

8. The data write circuit according to claim 7,
wherein the write mode designating data is data which designates control of writing the received pixel data, as the data corresponding thereto, into the memory.

9. The data write circuit according to claim 2,
wherein the write mode designating data is data which designates control of writing the received pixel data, as the data corresponding thereto, into the memory.

10. The data write circuit according to claim 1,
wherein the write mode designating data is data which designates control of writing data corresponding to the pixel data into the memory when the display state designating data affixed to the pixel data does not coincide with the first display state designating data.

11. The data write circuit according to claim 10,
wherein the write control data further contains second display state designating data for designating a specific display state, and
the write mode designating data is data which, when the display state designating data affixed to the pixel data coincides with the first display state designating data, designates control of writing into the memory data corresponding to pixel data with an affix of the second display state designating data, instead of writing data corresponding to the pixel data.

12. The data write circuit according to claim 11,
wherein the write mode designating data is data which designates control of writing the received pixel data, as the data corresponding thereto, into the memory.

13. The data write circuit according to claim 10,
wherein the write mode designating data is data which designates control of writing the received pixel data, as the data corresponding thereto, into the memory.

14. The data write circuit according to claim 1,
wherein the write control data further contains second display state designating data for designating a specific display state, and
the write mode designating data is data which, when the display state designating data affixed to the pixel data coincides with the first display state designating data, designates control of writing into the memory data corresponding to pixel data with an affix of the second display state designating data, instead of writing data corresponding to the pixel data.

15. The data write circuit according to claim 14,
wherein the write mode designating data is data which designates control of writing the received pixel data, as the data corresponding thereto, into the memory.

16. The data write circuit according to claim 1,
wherein the write mode designating data is data which designates control of writing the received pixel data, as the data corresponding thereto, into the memory.

17. The data write circuit according to any one of claims 1 to 5, further comprising:
a section which sets a plurality of groups of the write control data; and
a section which writes data corresponding to the pixel data into the memory by performing control of writing data corresponding to the pixel data, which is to be performed in accordance with each of the received groups of write control data, in accordance with a condition set depending on a relationship between groups of the write mode designating data in the respective groups of write control data.

* * * * *